(12) United States Patent
Fan

(10) Patent No.: US 12,132,022 B2
(45) Date of Patent: Oct. 29, 2024

(54) SEMICONDUCTOR DEVICES AND PREPARATION METHODS THEREOF

(71) Applicant: CHANGXIN MEMORY TECHNOLOGIES, INC., Hefei (CN)

(72) Inventor: Zengyan Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/430,856

(22) PCT Filed: Mar. 8, 2021

(86) PCT No.: PCT/CN2021/079567
§ 371 (c)(1),
(2) Date: Aug. 13, 2021

(87) PCT Pub. No.: WO2021/203887
PCT Pub. Date: Oct. 14, 2021

(65) Prior Publication Data
US 2023/0054495 A1    Feb. 23, 2023

(30) Foreign Application Priority Data

Apr. 10, 2020   (CN) .......................... 202010279566.8

(51) Int. Cl.
*H01L 23/00*    (2006.01)
*H01L 23/31*    (2006.01)

(52) U.S. Cl.
CPC .......... *H01L 24/14* (2013.01); *H01L 23/3171* (2013.01); *H01L 24/11* (2013.01);
(Continued)

(58) Field of Classification Search
CPC ....................................................... H01L 24/13
See application file for complete search history.

(56) References Cited

U.S. PATENT DOCUMENTS 7,795,127 B2    9/2010  Yamano
8,786,093 B2    7/2014  Lin et al.
(Continued)

FOREIGN PATENT DOCUMENTS

CN          101110398 A       1/2008
CN          101330028 A       12/2008
(Continued)

OTHER PUBLICATIONS

First CN Office Action cited in CN202010279566.8, mailed May 24, 2023, 8 pages.
(Continued)

*Primary Examiner* — Yu-Hsi D Sun
(74) *Attorney, Agent, or Firm* — Kilpatrick Townsend & Stockton LLP

(57) ABSTRACT

The present disclosure provides a semiconductor device and a preparation method thereof. The semiconductor device comprises: a semiconductor substrate; a passivation layer, arranged on an upper surface of the semiconductor substrate; a protective layer, arranged on an upper surface of the passivation layer, a dummy opening being formed on the protective layer; and, a dummy bump, partially located in the dummy opening and closely attached to the protective layer.

11 Claims, 6 Drawing Sheets

(52) U.S. Cl.
CPC .... *H01L 24/13* (2013.01); *H01L 2224/11019* (2013.01); *H01L 2224/11462* (2013.01); *H01L 2224/11622* (2013.01); *H01L 2224/13007* (2013.01); *H01L 2224/13018* (2013.01); *H01L 2224/13147* (2013.01); *H01L 2224/1403* (2013.01); *H01L 2224/14051* (2013.01); *H01L 2224/14517* (2013.01); *H01L 2924/35121* (2013.01)

(56) References Cited

U.S. PATENT DOCUMENTS

| | | | |
|---|---|---|---|
| 9,048,221 | B2 | 6/2015 | Hasegawa et al. |
| 9,711,477 | B2 | 7/2017 | Wu et al. |
| 10,818,627 | B2 | 10/2020 | Liu et al. |
| 2005/0253232 | A1 | 11/2005 | Ibaraki |
| 2006/0087034 | A1 | 4/2006 | Huang et al. |
| 2008/0124837 | A1* | 5/2008 | Takahira ................. H01L 24/81 |
| | | | 257/E23.021 |
| 2012/0129333 | A1 | 5/2012 | Yim et al. |
| 2015/0108635 | A1 | 4/2015 | Liang et al. |
| 2019/0067230 | A1* | 2/2019 | Liu ......................... H01L 24/09 |

FOREIGN PATENT DOCUMENTS

| | | |
|---|---|---|
| CN | 102623424 A | 8/2012 |
| CN | 102903683 A | 1/2013 |
| CN | 102956590 8 | 11/2015 |
| CN | 109427718 A | 3/2019 |

OTHER PUBLICATIONS

International Search Report cited in PCT/CN2021/079567 mailed Apr. 10, 2020, 10 pages.

* cited by examiner

SEMICONDUCTOR DEVICES AND PREPARATION METHODS THEREOF

CROSS-REFERENCE TO RELATED APPLICATIONS

The present disclosure claims the priority to Chinese Patent Application 202010279566.8, titled "SEMICONDUCTOR DEVICES AND PREPARATION METHODS THEREOF", filed on Apr. 10, 2020, which is incorporated herein by reference in its entirety.

TECHNICAL FIELD

The present disclosure relates to the field of semiconductor packaging, and in particular to a semiconductor device and a method for preparing a semiconductor device.

BACKGROUND OF THE PRESENT INVENTION

In the semiconductor packaging field in the related art, especially the disclosure of copper pillar bumps in the flip chip technology, dummy bumps are usually formed on the protective layer of the chip to be packaged before a flip chip process. The dummy bumps are specially formed on the protective layer by the existing processes. In the related art, the dummy bumps have no electrical connection function and are generally formed on the surface of the protective layer. However, since the protective layer and the dummy bumps are made of different materials, for example, the basis for the dummy bumps and the protective layer is the bonding between the metal and the high-molecular material and the bonding force is weak, the dummy bumps are easy to fall off. Moreover, since the bonding force between the dummy bumps and the high-molecular material is weak, it is likely to break, resulting in insecure structure of the semiconductor device.

SUMMARY OF THE PRESENT INVENTION

In order to solve the technical problem mentioned above, the present disclosure provides a semiconductor device, wherein the semiconductor device is stable in structure and the dummy bump is difficult to fall off.

The semiconductor device according to the embodiments of the present disclosure comprises: a semiconductor substrate; a passivation layer, arranged on an upper surface of the semiconductor substrate; a protective layer, arranged on an upper surface of the passivation layer, a dummy opening being formed on the protective layer; and, a dummy bump, partially located in the dummy opening and closely adhered to the protective layer.

For the semiconductor device according to the embodiments of the present disclosure, by forming the dummy opening in the protective layer and allowing the dummy bump be at least partially located in the dummy opening and closely adhered to the protective layer, the contact area of the dummy bump and the protective layer can be increased to enhance the bonding force. Moreover, the dummy bump can be fixed by the dummy opening, so the strength of fixed connection between the dummy bump and the protective layer is enhanced, the bonding strength between the dummy bump and the protective layer is enhanced, and the risk of falling off the dummy bump is reduced.

According to some embodiments of the present disclosure, the semiconductor device further comprises at least one conductive bump, a conductive pad being arranged on the semiconductor substrate, the passivation layer partially covering the conductive pad, the conductive bump passing through the protective layer and the passivation layer to be connected to the conductive pad.

According to some embodiments of the present disclosure, the dummy bump is formed by electroplating.

According to some embodiments of the present disclosure, a block groove communicated with the dummy opening is formed in the protective layer, a block portion is arranged on the dummy bump, and the block portion is located in the block groove.

Optionally, the block groove is formed by recessing a part of a sidewall forming the dummy opening in a direction away from the dummy opening.

Optionally, the block groove is formed as an annular groove extending in a circumferential direction of the dummy opening.

Optionally, the dummy opening runs through the protective layer in an up-down direction, and the block groove is formed at a lower end of the dummy opening and extends to a lower surface of the protective layer.

According to some embodiments of the present disclosure, the dummy opening runs through the protective layer, and an upper surface of the dummy opening has a first width, the first width is less than the maximum width of the dummy opening.

According to some embodiments of the present disclosure, the protective layer further covers exposed side faces of the passivation layer and partially covers the conductive pad.

According to some embodiments of the present disclosure, the semiconductor device further comprises: a seed layer, the seed layer is formed on a bottom of the dummy opening by sputtering and located between the dummy bump and the passivation layer.

The present disclosure further provides a method for preparing a semiconductor device, which can be used to prepare the semiconductor device in the above embodiments.

The method for preparing a semiconductor device according to the embodiments of the present disclosure comprises: providing a semiconductor substrate, a passivation layer being formed on an upper surface of the semiconductor substrate; forming a protective layer on the passivation layer; exposing and developing the protective layer, and removing a part of the protective layer to form a dummy opening; forming a mask layer on the protective layer, and exposing and developing a region of the mask layer corresponding to the dummy opening to form an electroplating opening communicated with the dummy opening; forming a dummy bump in the electroplating opening and the dummy opening; and, removing the mask layer to expose the dummy bump.

Optionally, after the removing a part of the protective layer to form a dummy opening and before the forming a mask layer on the protective layer, the method comprises: forming a seed layer on an upper surface of the protective layer and on a bottom of the dummy opening by sputtering; and, after the removing the mask layer to expose the dummy bump, the method comprises: removing the seed layer formed on the upper surface of the protective layer.

Optionally, the exposing and developing the protective layer and removing a part of the protective layer to form a dummy opening comprises: forming a dummy opening by direct light exposure, and forming a block groove by increased side light exposure, the block groove being communicated with the dummy opening.

Optionally, the exposing and developing the protective layer and removing a part of the protective layer to form a dummy opening comprises: exposing the protective layer by a preset mask, the preset mask comprising a first region portion and a second region portion, a light transmittance of the second region portion being greater than a light transmittance of the first region portion; removing the protective layer corresponding to the first region portion to form a dummy opening; and, removing a bottom of the protective layer corresponding to the second region portion to form a block groove, the block groove being communicated with the dummy opening.

Further, the forming a dummy bump in the electroplating opening and the dummy opening further comprises: forming a block portion of the dummy bump in the block groove.

BRIEF DESCRIPTION OF THE DRAWINGS

FIG. 3 is a sectional view of a partial structure of exposing and developing a protective layer in the method for preparing a semiconductor device according to an embodiment of the present disclosure, and FIG. 4 is a sectional view of a partial structure of exposing and developing a protective layer in method for preparing a semiconductor device according to another embodiment of the present disclosure.

in which:
100: semiconductor device;
1: semiconductor substrate; 11: passivation layer; 12: conductive pad;
2: protective layer; 21: dummy opening; 22: block groove;
3: dummy bump; 31: block portion;
4: seed layer;
5: mask; 51: first region portion; 52: second region portion;
6: conductive bump;
7: mask layer; 71: electroplating opening; 71: copper pillar; and, 73: solder joint.

DETAILED DESCRIPTION OF THE PRESENT INVENTION

The semiconductor device according to the present disclosure will be further described below in detail by embodiments with reference to the accompanying drawings.

Figure 1:
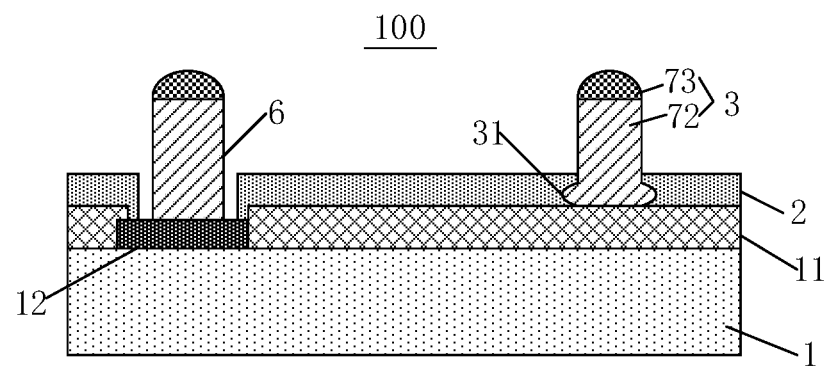
FIG. 1 is a schematic structure diagram of a semiconductor device according to an embodiment of the present disclosure.

As shown in FIG. 1, the semiconductor device 100 according to the embodiments of the present disclosure may comprise a semiconductor substrate 1, a passivation layer 11, a protective layer 2 and a dummy bump 3.

As shown in FIG. 1, the passivation layer 11 is arranged on an upper surface of the semiconductor substrate 1. Specifically, as shown in FIGS. 1-11, the passivation layer 11 is formed above the semiconductor substrate 1 and covers the upper surface of the semiconductor substrate 1, the protective layer 2 is arranged on an upper surface of the passivation layer 11 and covers the upper surface of the passivation layer, and a dummy opening 21 is formed in the protective layer 2. The dummy bump 3 can be used for connecting and supporting other components. The dummy bump 3 is partially located in the dummy opening 21 and closely adhered to the protective layer 2. That is, the dummy bump 3 partially extends into the protective layer 2 through the dummy opening 21, and is closely connected to a sidewall of the dummy opening 21. As shown in FIGS. 1 and 10-13, a lower end of the dummy bump 3 is located in the dummy opening 21 and connected to the sidewall of the dummy opening 21.

In the prior art, the dummy bump 3 is only arranged on the upper surface of the protective layer 2, and the dummy bump 3 and the protective layer 2 are connected by a bonding force of the metal and the high-molecular material. However, in the present disclosure, by allowing the dummy bump 3 to be at least partially located in the dummy opening 21 and closely connected to the sidewall of the dummy opening 21, the contact area of the dummy bump 3 and the protective layer 2 can be increased to enhance the bonding force. Moreover, the dummy bump 3 can be fixed by the dummy opening 21, so the strength of fixed connection between the dummy bump 3 and the protective layer 2 is enhanced, the bonding strength between the dummy bump 3 and the protective layer 2 is enhanced, and the risk of falling off the dummy bump 3 is reduced.

Optionally, as shown in FIG. 1, the semiconductor device 100 further comprises at least one conductive bump 6. Specifically, a conductive pad 12 may be arranged on the semiconductor substrate 1. The conductive pad 12 is formed above the semiconductor substrate 1. The conductive pad 12 is a metal pad. For example, the conductive pad 12 may be an aluminum pad or an aluminum copper pad, or may be made of other metal materials. The semiconductor substrate 1 may be a bulk silicon substrate or a silicon-on-insulator substrate, or may be made of other semiconductor materials, for example, a glass substrate, a ceramic substrate or the like. This is not specifically limited in the present disclosure.

The passivation layer 11 partially covers the conductive pad 12. Specifically, as shown in FIGS. 1-11, an opening is formed on the passivation layer 11 to expose the conductive pad 12. A part of the passivation layer 11 can cover an edge portion of the conductive pad 12. For the material of the passivation layer 11, the passivation layer 11 may be made of one or more of silicon oxide and silicon nitride. For example, the passivation layer 11 may be a single silicon oxide layer, or the passivation layer 11 may be formed by superposing silicon nitride layers and silicon oxide layers.

An opening is formed on the protective layer 2 to expose the conductive pad 12. The protective layer 2 can cover exposed side faces of the passivation layer 11 and partially cover the conductive pad 12. As shown in FIG. 1, openings suitable for allowing the conductive bump 6 to pass therethrough and exposing the conductive pad 12 are formed on the protective layer 2 and the passivation layer 11. A part of the opening formed in the protective layer 2 covers the edge of the conductive pad 12. Alternatively, the protective layer 2 can cover the upper surface of the passivation layer 11, and the side face of the edge of the opening formed in the protective layer 2 is flush with the side face of the edge of the opening formed in the passivation layer 11.

Optionally, the protective layer 2 may be formed from a photoresist. For example, the protective layer 2 may be formed from a negative photoresist or a positive photoresist. Further, the protective layer 2 may be a PI layer formed from polyimide, or may be a polybenzoxazole (PBO) layer or a benzocyclobutene (BCB) layer or be formed from other suitable polymers. Specifically, the photoresist may be coated on the upper surface of the passivation layer 11 to form the protective layer 2, and an opening is formed by exposure, development, etching and other processes using lithography to expose the conductive pad 12.

There may be one or more conductive bump 6 and one or more dummy bump 3. Preferably, there may be a plurality of conductive bumps 6 and a plurality of dummy bumps 3, wherein the conductive bumps 6 may be used for electrical connection to other components, the plurality of conductive bumps 6 are arranged at intervals, and each conductive bump 6 successively passes through the opening in the protective layer 2 and the opening in the passivation layer 11 to be connected to the conductive pad 12.

The plurality of dummy bumps 3 are arranged at intervals. The dummy bumps 3 can be used for connecting and supporting other components, but have no function of being electrically connected to other components. As for the arrangement of the dummy bumps 3, the dummy bumps 3 may be arranged at stress-concentrated positions when the semiconductor device 100 is connected to other components, so that it is advantageous for connection between the semiconductor device 100 and other components so as to improve the structural performance of the combined element.

Optionally, the dummy bump 3 is formed by electroplating. In other words, the dummy bump 3 is formed in the dummy opening 21 by an electroplating process, so that the connection between the dummy bump 3 and the protective layer 2 becomes closer, the stability of connection between the dummy bump 3 and the protective layer 2 can be further improved, and it is also advantageous for formation of the dummy bump 3. Specifically, the dummy opening 21 may be formed on the protective layer 2 through exposure and development by lithography, a mask layer 7 is formed by gumming on the protective layer 2, and an electroplating opening 71 correspondingly communicated with the dummy opening 21 is formed on the mask layer 7 by exposure and development. The dummy bump 3 is formed from the electroplating material in the electroplating opening 71 and the dummy opening 21. At the end of the electroplating process, the dummy bump 3 is exposed by a degumming process to form the semiconductor device 100. In the conventional methods, the conductive bump 6 and the dummy bump 3 are generally formed by one-step electroplating simultaneously. Since the horizontal position of the dummy bump 3 is higher, there is a large height difference caused between the conductive bump 6 and the dummy bump 3, and unbalance will be caused when it is connected to other components. By forming a block portion 31, the height difference between the conductive bump 6 and the dummy bump 3 can be reduced.

Figure 3:
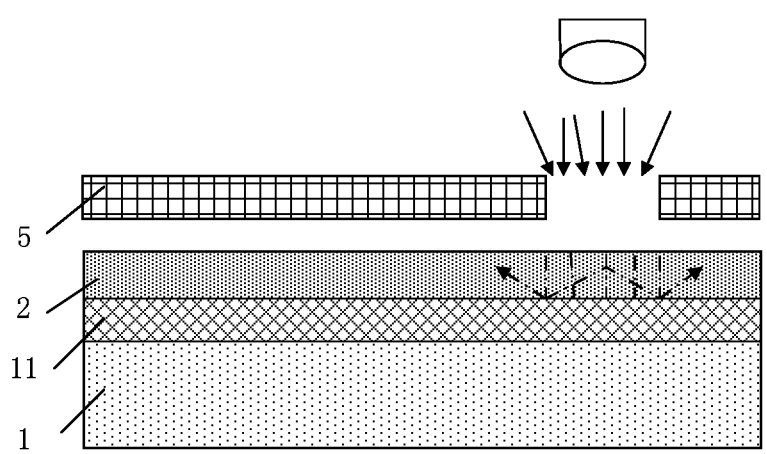
Figure 4:
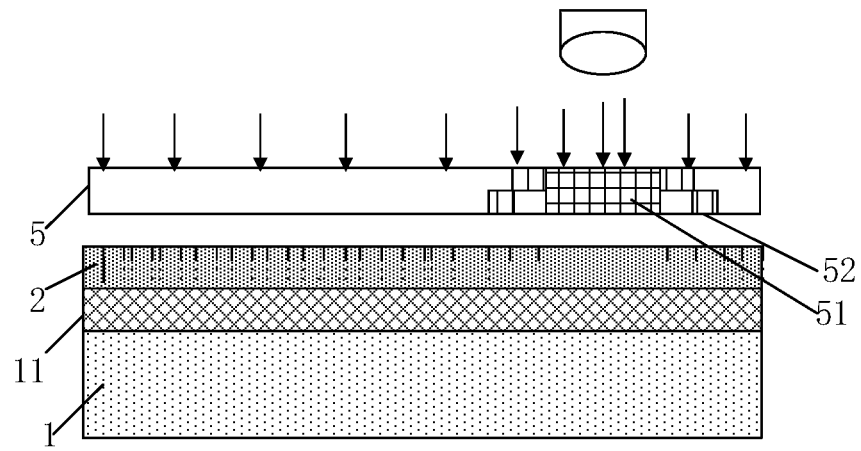

Optionally, as shown in FIGS. 5-13, a block groove 22 communicated with the dummy opening 21 is formed in the protective layer 2, a block portion 31 is arranged on the dummy bump 3, and the block portion 31 is located in the block groove 22. By cooperating the block groove 22 with the block portion 31, the dummy bump 3 can be fixed in the up-down direction, the bonding force between the dummy bump 3 and the protective layer 2 in the up-down direction can be enhanced, and the dummy bump 3 can be prevented from separating from the protective layer 2. Specifically, as shown in FIGS. 3 and 4, during the lithographic process of forming the dummy opening 21, the intensity and direction of the light source can be adjusted to form the block groove 22 in the protective layer 2. During the process of forming the dummy bump 3 by electroplating, the block portion 31 is formed in the block groove 22 by an electroplating process.

In the example shown in FIGS. 1 and 5-13, the block groove 22 may be formed by recessing a part of a sidewall forming the dummy opening 21 in a direction away from the dummy opening 21. Specifically, the block groove 22 is formed on a side of the dummy opening 21 and communicated with the side of the dummy opening 21. A block portion 31 corresponding to the block groove 22 is arranged on the side of the dummy bump 3. The block portion 31 is formed in the block groove 22 by electroplating. By the cooperation of the block groove 22 with the block portion 31, the dummy bump 3 can be fixed in the up-down direction, and the dummy bump 3 can be prevented from separating from the protective layer 2.

Further, the block groove 22 may be an annular groove extending in a circumferential direction of the dummy opening 21, and the block portion 31 forms an annular shape matched with the annular groove structure. In this way, the bonding strength between the protective layer 2 and the dummy bump 3 can be further improved by the annular block groove 22 and the block portion 31, so that the dummy bump 3 is further prevented from falling off.

Optionally, as shown in FIGS. 5-13, the dummy opening 21 runs through the protective layer 2 in the up-down direction. Thus, the dummy bump 3 can be exposed from the protective layer 2 to be connected to other components, the formation of the dummy bump 3 in the dummy opening 21 can be further enhanced, and the fixation strength of the dummy bump 3 can be improved. Furthermore, as shown in FIG. 3, the block groove 22 may be formed by adding side light during the process of forming the dummy opening 21. The side light is emitted when it contacts the passivation layer 11 on the bottom of the protective layer 2, so that the part of the protective layer 2 corresponding to the formation of the block groove 22 is irradiated and developed by light and then removed. Thus, it is advantageous to control the light source to form the block groove 22 in the lithographic process. However, the way of forming the block groove 22 is not limited thereto. The block groove 22 is formed at a lower end of the dummy opening 21 and extends to a lower surface of the protective layer 2. That is, the lower end of the block groove 22 extends to the upper surface of the passivation layer 11. In this way, the block portion 31 is formed in the block groove 22, and the block portion 31 is located below the protective layer 2, so that the dummy bump 3 can be prevented from falling off by the protective layer 2.

Figure 13:
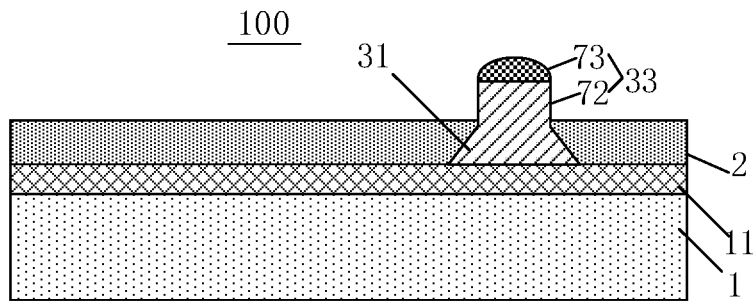
FIG. 13 is a schematic structure diagram of a semiconductor device according to still another embodiment of the present disclosure.
Figure 14:
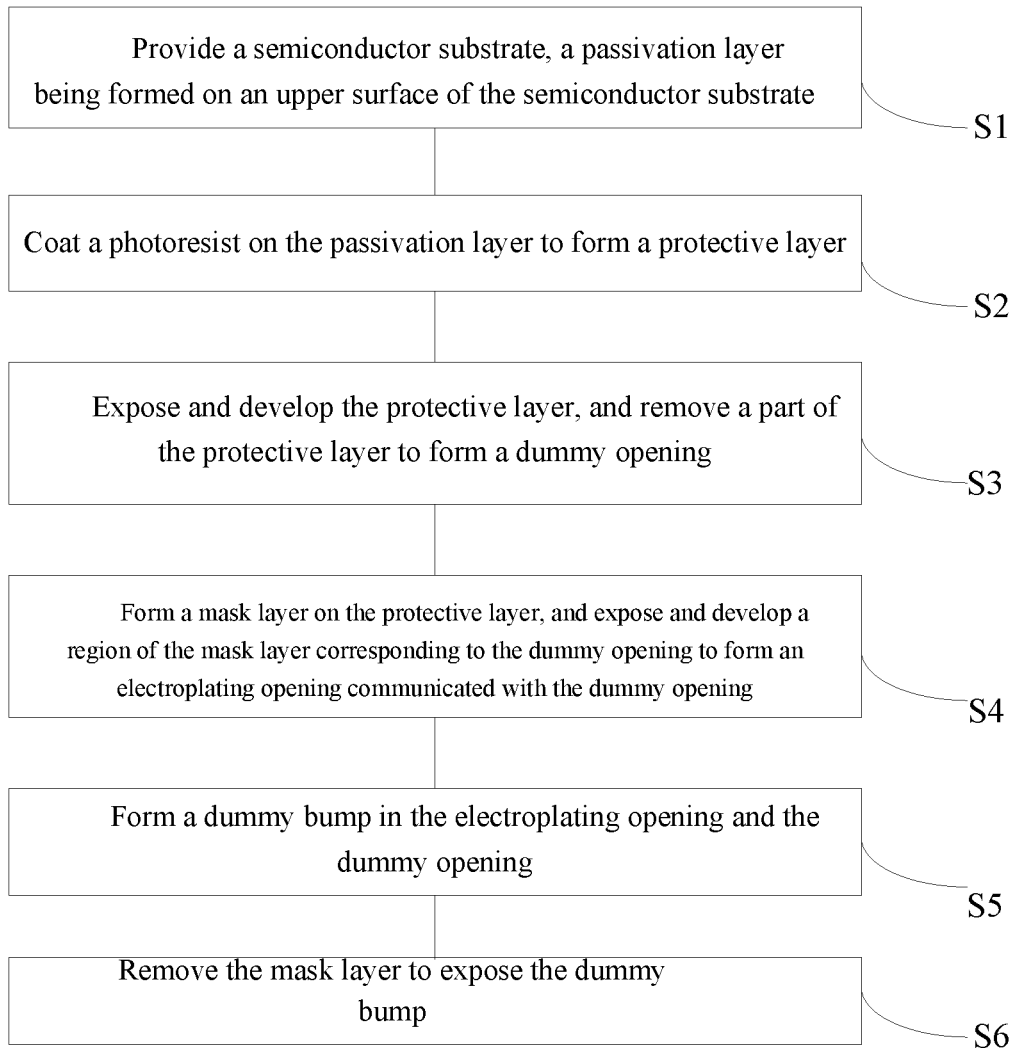
FIG. 14 is a flowchart of a method for preparing a semiconductor device according to an embodiment of the present disclosure.
Figure 15:
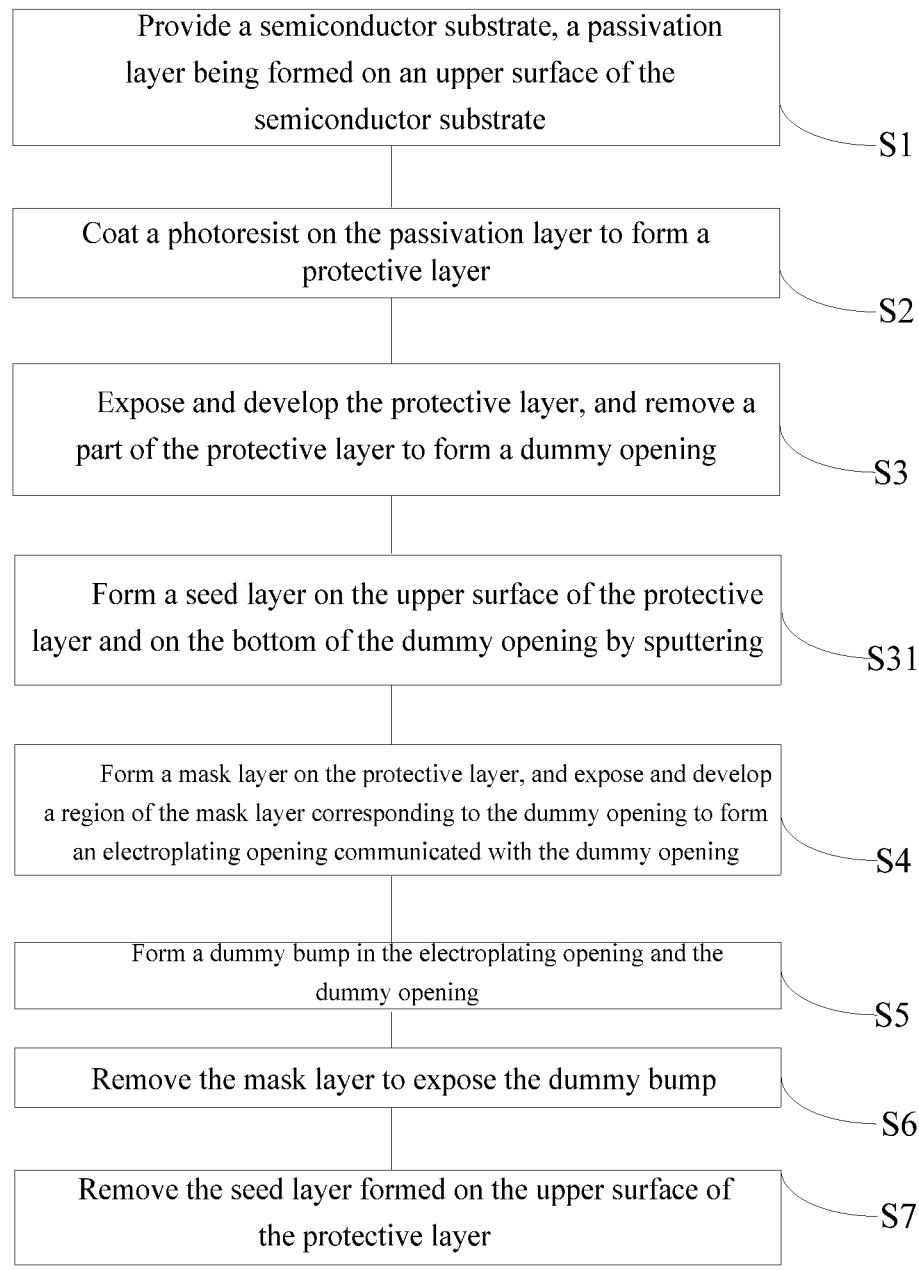
FIG. 15 is a flowchart of a method for preparing a semiconductor device according to another embodiment of the present disclosure.

In some examples of the present disclosure, as shown in FIG. 13, the dummy opening 21 runs through the protective layer 2 and the upper surface of the dummy opening 21 has a first width that is less than the maximum width of the dummy opening 21. That is, the cross-section of the dummy opening 21 in the up-down direction is different in width. The width of the upper surface of the dummy opening 21 in the longitudinal section is the first width. The position where the dummy opening 21 has the maximum width is lower than the upper surface of the dummy opening 21. In this way, the dummy opening 21 can form a structure with a narrow upper side and a wide lower side, and the dummy bump 3 can thus be prevented from falling off from the dummy opening 21. For example, the dummy opening 21 may be formed as a circular truncated cone shape, the cross-section of the dummy opening 21 in the up-down direction is formed as a trapezoidal shape, and the width of the dummy opening 21 gradually increase from the top down.

In some examples of the present disclosure, the protective layer 2 further covers side faces of the passivation layer 11 and partially covers the conductive pad 12. In other examples of the present disclosure, the protective layer 2 can cover the upper surface of the passivation layer 11 and be flush with the side face of the passivation layer 11 exposed from the conductive pad 12.

Figure 6:
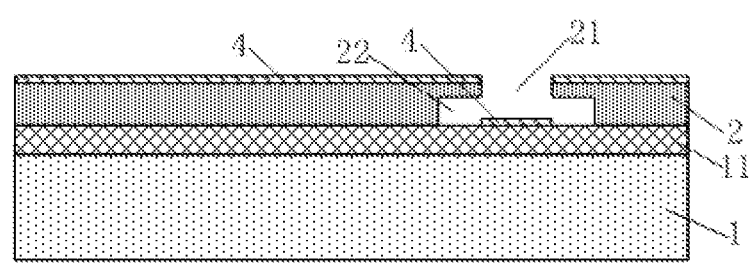
Figure 11:
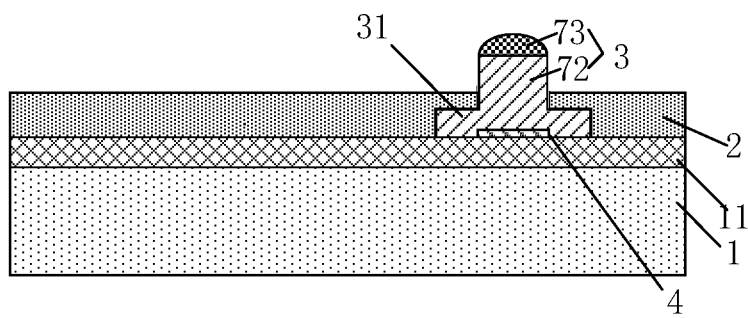
Figure 12:
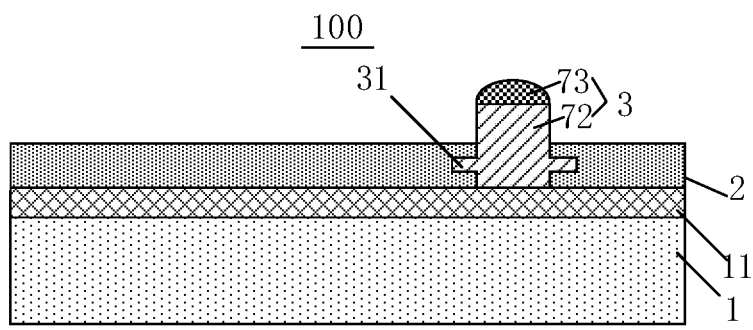
FIG. 12 is a schematic structure diagram of a semiconductor device according to another embodiment of the present disclosure.

Optionally, the semiconductor device 100 may further comprise a seed layer 4. As shown in FIG. 6, the seed layer 4 is formed on the bottom of the dummy opening 21 by sputtering; and, as shown in FIG. 11, the seed layer 4 in the finally formed semiconductor device 100 is located between the dummy bump 3 and the passivation layer 11. In this way, at least part of the bottom of the dummy bump 3 can be connected to the passivation layer 11 through the seed layer 4. By using the seed layer 4, the bonding strength between the bottom of the dummy bump 3 and the passivation layer 11 can be further enhanced, and the risk of falling off the dummy bump can be reduced.

The present disclosure further provides a method for preparing a semiconductor device 100. The method for preparing a semiconductor device according to the embodiments of the present disclosure can be used to prepare the semiconductor device 100 in the above embodiments.

As shown in FIGS. 2-15, the method for preparing a semiconductor device 100 according to the embodiments of the present disclosure may comprise:

S1: A semiconductor substrate 1 is provided, and a passivation layer 11 is formed on an upper surface of the semiconductor substrate 1. A conductive pad 12 is further arranged on the upper surface of the semiconductor substrate 1. The passivation layer 11 is arranged above the conductive pad 12, and a part of the passivation layer 11 covers an edge of the conductive pad 12. An opening is formed on the passivation layer 11 to expose the conductive pad 12. A conductive bump 6 passes through the passivation layer 11 to be connected to the conductive pad 12.

Figure 2:
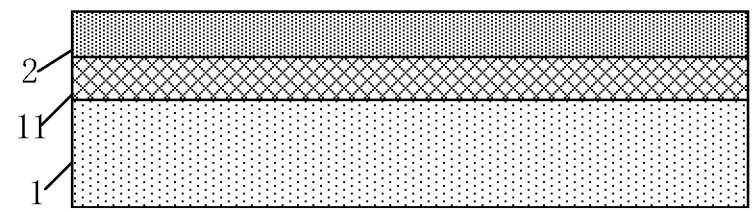
FIGS. 2-11 are partial sectional views of steps of a method for preparing a semiconductor device according to embodiments of the present disclosure, where

S2: As shown in FIG. 2, a protective layer 2 is formed on the passivation layer 11. Specifically, a photoresist may be coated on the upper surface of the passivation layer 11 to form the protective layer 2. For example, the photoresist may be coated on the passivation layer 11 by a photoresist spinner. For the photoresist, the photoresist may be a positive photoresist, for example, a polyimide photoresist. The polyimide photoresist has remarkable heat resistance, and excellent mechanical properties, insulation performance and corrosion resistance. By coating the polyimide photoresist on the passivation layer 11, the effects of insulation, corrosion resistance, stress buffering, and planarization can be achieve. Meanwhile, the PI (polyimide) layer itself has protection and stress buffering functions, so the structural stability of the product is improved greatly, the surface of the chip can be protected from damage by stress, the surface of the chip becomes flatter, and it is advantageous to improve the uniformity and bonding force in the subsequent electroplating process. The protective layer 2 may also adopt a negative photoresist. The pattering process can be performed by different masks 5 according to different photoresists.

Figure 5:
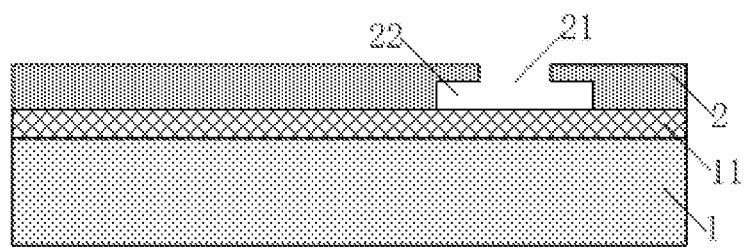

S3: The protective layer 2 is exposed and developed, and a part of the protective layer 2 is removed to form the dummy opening 21. Specifically, the protective layer 2 may be exposed and developed, and a part of the protective layer 2 corresponding to the region where the dummy opening 21 is to be formed is removed to form the dummy opening 21. As shown in FIGS. 3-5, a mask 5 may be arranged above the protective layer 2. The protective layer 2 is exposed by the mask 5, and the photoresist is dissolved by a development solution to remove a part of the protective layer 2 where the dummy opening 21 is to be formed, so that the dummy opening 21 can be formed in the protective layer 2.

As shown in FIG. 5, the dummy opening 21 can extend in the up-down direction and runs through the protective layer 2. As shown in FIG. 3, during the exposure process, the light source irradiates the mask 5. The light emitted by the light source may comprise direct light, i.e., light irradiated vertically in the up-down direction. After development, the dummy opening 21 extending in the up-down direction can be formed in the protective layer 2. A dummy bump 3 may be formed in the dummy opening 21. The dummy bump 3 is partially located in the protective layer 2 through the dummy opening 21, so that the dummy bump 3 can be fixed by the protective layer 2 and the dummy bump 3 can be prevented from falling off.

Optionally, a block groove 22 may be further formed in the protective layer 2. The block groove 22 is communicated with the dummy opening 21, the dummy bump 3 is formed in the block groove 22 and the dummy opening 21, and the dummy bump 3 is provided with a block portion 31 in the block groove 22. In this way, by cooperating the block portion 31 with the block groove 22, the dummy bump 3 can be fixed in the up-down direction, and the dummy bump 3 can be further prevented from falling off.

For the formation of the block groove 22, optionally, in the example shown in FIG. 3, in the process of exposing and developing the protective layer 2 and removing a part of the protective layer 2 to form the dummy opening 21, exposure and development may be performed by using a positive photoresist. During exposure, the dummy opening 21 is formed by direct light exposure, and the block groove 22 is formed by side light exposure. That is, during the exposure process, the dummy opening 21 and the block groove 22 can be formed after development by adjusting the irradiation direction of the light source (e.g., a UV lamp). Specifically, as shown in FIG. 3, the irradiated light may comprise direct light (light in the up-down direction shown in FIG. 3) and side light. The side light is reflected when contacting the passivation layer 11 on the bottom, so that a part of the bottom of the protective layer 2 where the block groove 22 is to be formed is irradiated by light. In this way, after development, a part of the protective layer 2 where the dummy opening 21 and the block groove 22 are to be formed are degummed and hollowed out by the developing solution, so as to form the dummy opening 21 and the block groove 22.

In other examples of the present disclosure, as shown in FIG. 4, exposing and developing the protective layer 2 and removing a part of the protective layer 2 to form the dummy opening 21, negative lithography may also be employed. The mask 5 used in the negative lithography is different in light transmittance, and a region of the mask 5 corresponding to the position where the dummy opening 21 is to be formed and a region of the mask 5 corresponding to the position where the block groove 222 is to be formed are different in light transmittance. Specifically, this step comprises: exposing the protective layer 2 by a preset mask 5, the preset mask 5 comprising a first region portion 51 and a second region portion 52, the light transmittance of the second region portion 52 being greater than that of the second region portion 52; removing the protective layer corresponding to the first region portion 51 to form the dummy opening 21; and, removing the bottom of the protective layer corresponding to the second region portion 52 to form the block groove 22, the block groove 22 being communicated with the dummy opening 21.

As shown in FIGS. 4 and 5, the first region portion 51 corresponds to the position where the dummy opening 21 is to be formed, the second region portion 52 corresponds to the position where the block groove 22 is to be formed, and the light transmittance of the second region portion 52 is greater than that of the first region portion 51. In this way, during the exposure process, the light reaching the position where the dummy opening 21 is to be formed and the light reaching the position where the block groove 22 is to be formed are different in intensity, and the light is irradiated on the protective layer 2 through the second region portion 52. As a result, the intensity of the light irradiated on the part of the protective layer 2 where the block groove 22 is to be formed is less than that of the light on the protective layer 2 that is not covered by the mask 5, and the light reaching the part of the protective layer 2 where the block groove 22 is to be formed is not enough to crosslink. Thus, after development, the protective layer 2 is hollowed out at the position where the dummy opening 21 is to be formed and the position where the block groove 22 is to be formed. Further, the mask 5 used in the negative lithography may be designed by a mesh technology. For example, the second region portion 52 of the mask 5 is arranged in a grid shape and may be composed of at least two material layers.

Figure 7:
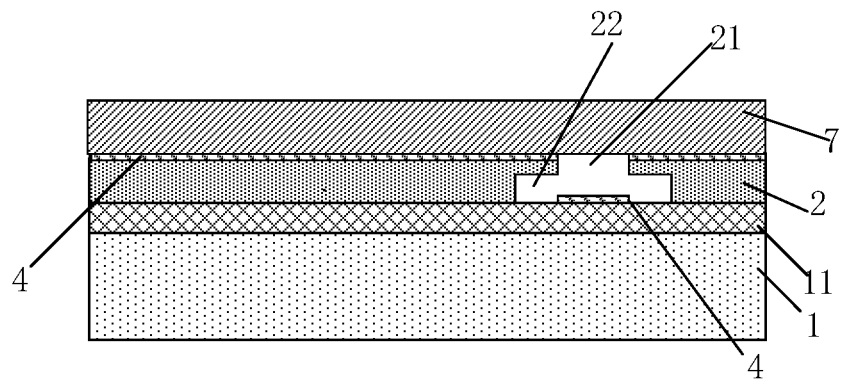
Figure 8:
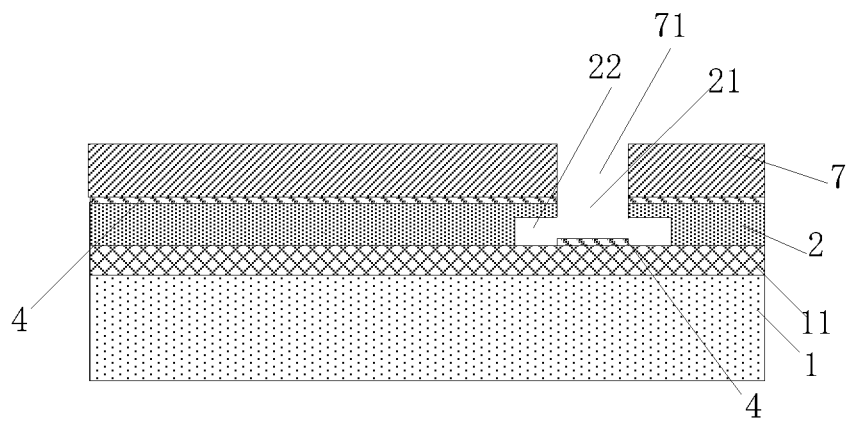
Figure 9:
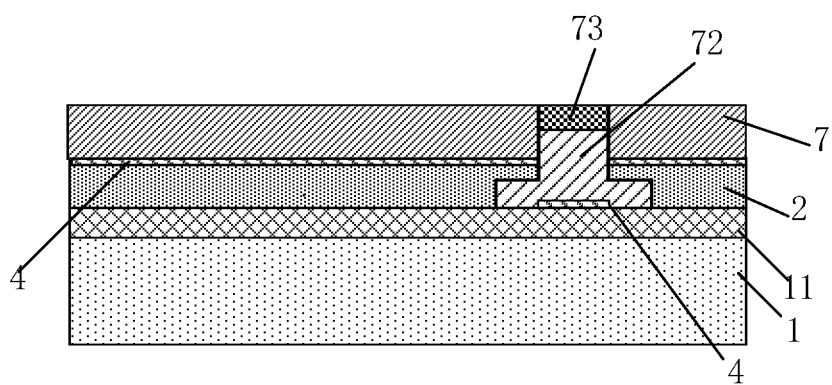

S4: A mask layer 7 is formed on the protective layer 2, and a region of the mask layer 7 corresponding to the dummy opening 21 is exposed and developed to form an electroplating opening 71 communicated with the dummy opening 21. Specifically, as shown in FIGS. 7-9, after the dummy opening 21 is formed in the protective layer 2, the upper surface of the protective layer 2 is gummed again to form a mask layer 7. The mask layer 7 covers the upper surface of the protective layer 2 and covers the dummy opening 21. Then, an electroplating opening 71 is formed in the mask layer 7 by exposure. The electroplating opening 71 is formed above the dummy opening 21 and corresponds to the dummy opening 21. The cross-section of the electroplating opening 71 is the same as that of the upper portion of the dummy opening 21.

Thus, the electroplating opening 71 and the dummy opening 21 are correspondingly communicated with each other in the up-down direction.

S5: S5: A dummy bump 3 is formed in the electroplating opening 71 and the dummy opening 21. As shown in FIG. 9, specifically, the dummy bump 3 matched with the electroplating opening 71 and the dummy opening 21 in shape may be formed from the electroplating material in the electroplating opening 71 and the dummy opening 21. For example, an electroplating copper material may be provided in the electroplating opening 71 and the dummy opening 21 to form a copper pillar 72, and an electroplating tin material may be provided above the copper pillar 72 to form a solder joint 73. The copper pillar 72 and the solder joint 73 form the dummy bump 3. Further, the block groove 22 may be formed on a side of the dummy opening 21 after exposure and development, and the block portion 31 may be formed in the block groove 22 after electroplating. The block portion 31 forms a part of the dummy bump 3. By bonding the dummy bump 3 with the protective layer 2, the bonding strength can be further improved, and the dummy bump can be prevented from falling off.

S6: The mask layer 7 is removed to expose the dummy bump 3. Specifically, at the end of electroplating, the mask layer 7 for defining the electroplating position above the protective layer 2 is removed by a degumming process using a degumming solution, so that the dummy bump 3 is partially exposed, and it is convenient for connection to other components. Further, the solder joint 73 of the dummy bump 3 can be reflowed after the degumming process, so that the structure of the dummy bump 3 is more stable. It is also possible that the solder joint 73 of the dummy bump 3 is reflowed and then degummed.

Figure 10:
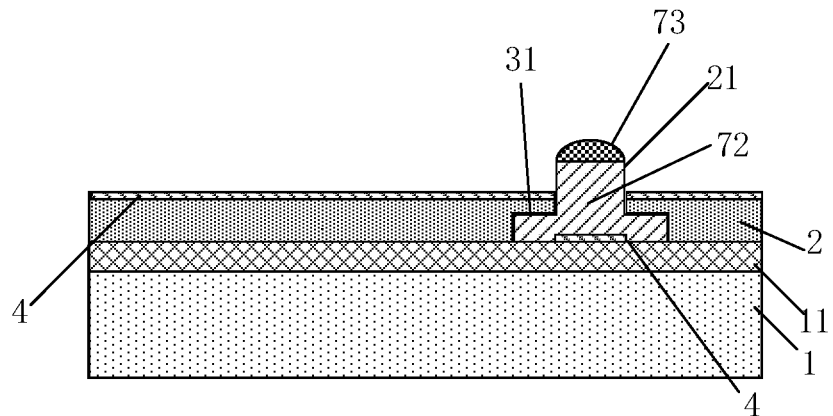

In some specific embodiments of the present disclosure, after the removing a part of the protective layer 2 to form the dummy opening 21 and before the forming a mask layer 7 on the protective layer 2, the method comprises: S31: forming a seed layer 4 on the upper surface of the protective layer 2 and on the bottom of the dummy opening 21 by sputtering, as shown in FIGS. 10-11; and, after the removing the mask layer to expose the dummy bump, the method comprises: S7: removing the seed layer 4 formed on the upper surface of the protective layer 2. As shown in FIG. 6, the seed layer 4 is formed on the bottom of the dummy opening 21, and the seed layer 4 is located between the dummy bump 3 and the passivation layer 11. By forming the seed layer 4, the connection strength between the dummy bump 3 and the passivation layer 11 can be enhanced. In the process of removing the seed layer 4 formed on the upper surface of the protective layer 2, the seed layer may be removed by etching. For example, it is possible to adopt dry etching or wet etching.

The above description merely shows the preferred implementations of the present disclosure. It should be noted that for a person of ordinary skill in the art, various improvements and modifications may be made without departing from the principle of the present disclosure, and those improvements and modifications shall also be regarded as falling into the protection scope of the present disclosure.

The invention claimed is:

1. A semiconductor device, comprising:
a semiconductor substrate;
a passivation layer, arranged on an upper surface of the semiconductor substrate;
a protective layer, arranged on an upper surface of the passivation layer, a dummy opening with a block groove being formed on the protective layer;
a dummy bump, partially located in the dummy opening and closely adhered to the protective layer, wherein a block portion of the dummy bump, located in the block groove, directly adhered to the passivation layer; and
a seed layer, formed on a bottom of the dummy opening by sputtering and located between the dummy bump and the passivation layer.

2. The semiconductor device according to claim 1, further comprising at least one conductive bump, a conductive pad being arranged on the semiconductor substrate, the passivation layer partially covering the conductive pad, the at least one conductive bump passing through the protective layer and the passivation layer to be connected to the conductive pad.

3. The semiconductor device according to claim 2, wherein the protective layer further covers exposed side faces of the passivation layer and partially covers the conductive pad.

4. The semiconductor device according to claim 1, wherein the dummy bump is formed by electroplating.

5. The semiconductor device according to claim 1, wherein the block groove is formed by recessing a part of a sidewall forming the dummy opening in a direction away from the dummy opening.

6. The semiconductor device according to claim 1, wherein the block groove is formed as an annular groove extending in a circumferential direction of the dummy opening.

7. The semiconductor device according to claim 1, wherein the dummy opening runs through the protective layer in an up-down direction, and the block groove is formed at a lower end of the dummy opening and extends to a lower surface of the protective layer.

8. The semiconductor device according to claim 1, wherein the dummy opening runs through the protective layer, and an upper surface of the dummy opening has a first width, the first width is less than a maximum width of the dummy opening.

9. A method for preparing a semiconductor device, comprising:
   providing a semiconductor substrate, a passivation layer being formed on an upper surface of the semiconductor substrate;
   forming a protective layer on the passivation layer;
   exposing and developing the protective layer, removing a part of the protective layer to form a dummy opening by direct light exposure, and exposing part of the passivation layer, wherein a block groove of the dummy opening is formed by side light exposure;
   forming a mask layer on the protective layer, and exposing and developing a region of the mask layer corresponding to the dummy opening to form an electroplating opening in communication with the dummy opening;
   forming a dummy bump with a block portion in the electroplating opening and the dummy opening;
   removing the mask layer to expose the dummy bump;
   wherein the semiconductor device comprises:
   the semiconductor substrate;
   the passivation layer, arranged on the upper surface of the semiconductor substrate;
   the protective layer, arranged on an upper surface of the passivation layer, the dummy opening with the block groove being formed on the protective layer;
   the dummy bump, partially located in the dummy opening and closely adhered to the protective layer, wherein the block portion of the dummy bump, located in the block groove, directly adhered to the passivation layer; and
   a seed layer, formed on a bottom of the dummy opening by sputtering and located between the dummy bump and the passivation layer.

10. The method for preparing a semiconductor device according to claim 9, wherein, after the removing a part of the protective layer to form a dummy opening and before the forming a mask layer on the protective layer, the method comprises: forming a seed layer on a bottom of the dummy opening by sputtering; and
   after the removing the mask layer to expose the dummy bump, the method comprises:
   removing the seed layer formed on the upper surface of the protective layer.

11. The method for preparing a semiconductor device according to claim 9, wherein the exposing and developing the protective layer and removing a part of the protective layer to form a dummy opening comprises:
   exposing the protective layer by a preset mask, the preset mask comprising a first region portion and a second region portion, a light transmittance of the second region portion being greater than a light transmittance of the first region portion;
   removing the protective layer corresponding to the first region portion to form the dummy opening; and
   removing a bottom of the protective layer corresponding to the second region portion to form the block groove.

* * * * *